US006816097B2

(12) United States Patent
Brooks et al.

(10) Patent No.: US 6,816,097 B2
(45) Date of Patent: Nov. 9, 2004

(54) SYSTEM AND METHOD FOR PERFORMING DIGITAL-TO-ANALOG CONVERSION USING A SIGMA-DELTA MODULATOR

(75) Inventors: Todd L. Brooks, Laguna Beach, CA (US); David S. P. Ho, Singapore (SG); Kevin L. Miller, Lawrenceville, GA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/379,593

(22) Filed: Mar. 6, 2003

(65) Prior Publication Data

US 2003/0156051 A1 Aug. 21, 2003

Related U.S. Application Data

(63) Continuation of application No. 09/949,814, filed on Sep. 12, 2001, now Pat. No. 6,531,973.
(60) Provisional application No. 60/231,825, filed on Sep. 11, 2000, and provisional application No. 60/232,157, filed on Sep. 11, 2000.

(51) Int. Cl.[7] .............................................. H03M 3/00
(52) U.S. Cl. ...................................... 341/143; 341/144
(58) Field of Search ................................ 341/143, 144, 341/118

(56) References Cited

U.S. PATENT DOCUMENTS

| 5,055,846 | A | 10/1991 | Welland ....................... 341/155 |
| 5,138,317 | A | 8/1992 | Story .......................... 341/143 |
| 5,221,926 | A | 6/1993 | Jackson ....................... 341/118 |
| 5,323,157 | A | 6/1994 | Ledzius et al. ............. 341/143 |
| 5,404,142 | A | 4/1995 | Adams et al. .............. 341/144 |
| 5,406,283 | A | 4/1995 | Leung ......................... 341/143 |
| 5,684,482 | A | 11/1997 | Galton ........................ 341/144 |
| 5,706,308 | A | 1/1998 | Ichimura .................... 375/247 |
| 5,760,726 | A | 6/1998 | Koifman et al. ........... 341/145 |
| 6,198,417 | B1 * | 3/2001 | Paul ........................... 341/143 |
| 6,215,423 | B1 * | 4/2001 | May et al. .................... 341/61 |
| 6,340,940 | B1 | 1/2002 | Melanson ................... 341/143 |
| 6,344,812 | B1 * | 2/2002 | Takeda et al. ............. 341/143 |
| 6,348,884 | B1 | 2/2002 | Steensgaard-Madsen .... 341/118 |
| 6,385,588 | B2 | 5/2002 | Van Der Vleuten ........ 704/504 |
| 6,392,579 | B1 * | 5/2002 | Rezvani et al. ............ 341/152 |
| 6,426,714 | B1 | 7/2002 | Ruha et al. ................. 341/143 |
| 6,518,899 | B2 * | 2/2003 | Yu ............................. 341/118 |
| 6,531,973 | B2 | 3/2003 | Brooks et al. ............. 341/143 |

FOREIGN PATENT DOCUMENTS

| EP | 0 899 884 | 3/1999 |
| EP | 1 162 749 | 12/2001 |

OTHER PUBLICATIONS

Adams, R. et al., "A 113dB Oversampling DAC with Segmented Noise–Shaped Scrambling," *IEEE International Solid–State Circuits Conference Digest of Technical Papers*, IEEE, vol. 41, Feb. 1998, pp. 62–63.

(List continued on next page.)

*Primary Examiner*—Peguy JeanPierre
(74) *Attorney, Agent, or Firm*—Sterne, Kessler, Goldstein & Fox P.L.L.C.

(57) ABSTRACT

The present invention is directed to a sigma-delta digital to analog converted (DAC) including a digital-sigma delta modulator, a decimation filter, and a multi-bit DAC. The digital sigma-delta modulator receives a digital input signal and produces a quantized digital signal therefrom. The decimation filter receives the quantized digital signal and produces a decimated digital signal therefrom. The multi-bit DAC receives the decimated digital signal and produces an analog output signal therefrom. The analog output signal is representative of the digital input signal.

19 Claims, 11 Drawing Sheets

OTHER PUBLICATIONS

Baird, R. and Fiez, T., "Linearity Enhancement of Multibit ΔΣ A/D and D/A Converters Using Data Weighted Averaging," *IEEE Transactions on Circuits and Systems II: Analog and Digital Signal Processing*, IEEE, vol. 42, No. 12, Dec. 1995, pp. 753–762.

Carley, L.R., "A Noise–Shaping Coder Topology for 15+ Bit Converters," IEEE Journal of Solid–State Circuits, IEEE, vol. 24, No. 2, Apr. 1989, pp. 267–273.

Chen, F. and Leung, B., "A High Resolution Multibit Sigma–Delta Modulator with Individual Level Averaging," *IEEE Journal of Solid–State Circuits*, IEEE, vol. 30, No. 4, pp. 453–460.

Fogleman, E. et al., "An Area–Efficient Differential Input ADC with Digital Common Mode Rejection," *Proceedings of the IEEE International Symposium on Circuits and Systems*, IEEE, Jun. 1999, 4 pages.

Fogleman, E. et al., "A Dynamic Element Matching Technique for Reduced–Distortion Multibit Quantization in Delta–Sigma ADCS," *Proceedings of the International Symposium on Circuits and Systems*, IEEE, Jun. 1999, 4 pages.

Fogleman, E. et al., "A 3.3V Single–Poly CMOS Audio ADC Delta–Sigma Modulator with 98dB Peak SINAD," *Proceedings of the IEEE 1999 Custom Integrated Circuits Conference*, IEEE, May 1999, pp. 121–124.

Galton, I., "Spectral Shaping of Circuit Errors in Digital–to–Analog Converters," *IEEE Transactions on Circuits and Systems II: Analog and Digital Signal Processing*, IEEE, vol. 44, No. 10, Oct. 1997, pp. 808–817.

Galton, I., "Noise–Shaping D/A Converters for ΔΣ Modulation," Proceedings of the 1996 IEEE International Symposium on Circuits and Systems, IEEE, 1996, pp. 441–444.

Galton, I., "A Rigorous Error Analysis of D/A Conversion with Dynamic Element Matching," *IEEE Transactions on Circuits and Systems II: Analog and Digital Signal Processing*, IEEE, vol. 42, No. 12, Dec. 1995, pp. 763–772.

Henderson, R.K. and Nys, O.J.A.P., "Dynamic Element Matching Techniques with Arbitrary Noise Shaping Function," *Proceedings of the 1996 IEEE International Symposium on Circuits and Systems*, IEEE, vol. 1, May 1996, pp. 293–296.

Jensen, H. and Galton, I., "A Hardware–Efficient DAC for Direct Digital Synthesis," *Proceedings of the IEEE International Symposium on Circuits and Systems*, IEEE, Jun. 1996, pp. 97–100.

Jensen, H. and Galton, I., A Reduced–Complexity Mismatch–Shaping DAC for Delta–Sigma Data Converters, *Proceedings of the IEEE International Symposium on Circuits and Systems*, IEEE, Jun. 1998, pp. I504–I507.

Jensen, H. and Galton, I., "Yield Estimation of a First–Order Noise–Shaping D/A Converter," *Proceedings of the IEEE International Symposium on Circuits and Systems*, IEEE, Jun. 1997, pp. 441–444.

Jensen, H. and Galton, I., "A Low–Complexity Dynamic Element Matching DAC for Direct Digital Synthesis," *IEEE Transactions on Circuits and Systems II: Analog and Digital Signal Processing*, vol. 45, No. 1, jan. 1998, pp. 13–27.

Ju, P. et al., A 22–kHz Multibit Switched–Capacitor Sigma–Delta D/A Converter with 92 dB Dynamic Range, *IEEE Journal of Solid–State Circuits*, vol. 30, No. 12, Dec. 1995, pp. 1316–1325.

Keady, A. and Lyden, C., "Tree structure for mismatch noise–shaping multibit DAC," *Electronic Letters*, IEEE, vol. 33, No. 17, Aug. 14, 1997, pp. 1431–1432.

Kwan, T. et al., "A Stereo Multibit EΔ DAC with Asynchronous Master–Clock Interface," *IEEE Journal of Solid–State Circuits*, IEEE, vol. 31, No. 12, Dec. 1996, pp. 1881–1887.

Leung, B. and Sutarja, S., "Multibit E–Δ A/D Converter Incorporating a Novel Class of Dynamic Element Matching Techniques," *IEEE Transactions on Circuits and Systems II: Analog and Digital Signal Processing*, vol. 39, No. 1, Jan. 1992, pp. 35–51.

Schreier, R. and Zhang, B., "Noise–shaped multibit D/A converter employing unit elements," *Electronic Letters*, IEEE, vol. 31, No. 20, Sep. 28, 1995, pp. 1712–1713.

Yasuda, A. et al., "A 100kHz 9.6mW Multi–bit ΔΣ DAC and ADC using Noise Shaping Dynamic Elements Matching with Tree Structure," *Proceedings of the 1998 IEEE International Solid–State Circuits Conference Digest of Technical Papers*, Feb. 1998, pp. 64–65.

Baird, R. et al., "Improved EΔ DAC linearity using data weighted averaging," Proceedings of the 1995 IEEE International Symposium on Circuits and Systems, IEEE, Apr. 30–May 1995, pp. 13–16.

Carley, L. et al., A 16 bit 4'th Order Noise–Shaping D/A Converter, *IEEE Proceedings of the CICC*, IEEE, 1988, pp. 482–485.

Schreier, R., "Am empirical study of high–order, single–bit delta sigma modulators," *IEEE Transactions on Circuits and Systems II: Analog and Digital Signal Processing*, IEEE, vol. 40, No. 8, Aug. 1993, pp. 461–466.

Jensen, H. and Galton, I., "A Performance Analysis of the Partial Randomization Dynamic Element Matching DAC Architecture," *Proceedings of the IEEE International Symposium on Circuits and Systems*, IEEE, Jun. 1997, pp. 9–12.

Lin, H. et al., "Multi–Bit DAC with Noise–Shaped Element Mismatch," *Proceedings of the IEEE International Symposium on Circuits and Systems*, IEEE, 1996, pp. 235–238.

Nys, O.J.A.P. and Henderson, R.K., "An Analysis of Dynamic Element Matching Techniques in Sigma–Delta Modulation." *Proceedings of the IEEE International Symposium on Circuits and Systems*, IEEE, 1996, pp. 231–234.

\* cited by examiner

SYSTEM AND METHOD FOR PERFORMING DIGITAL-TO-ANALOG CONVERSION USING A SIGMA-DELTA MODULATOR

CROSS-REFERENCE TO RELATED APPLICATIONS

This application is a continuation of U.S. Ser. No. 09/949,814. filed Sep. 12, 2001, now U.S. Pat. No. 6,531,973, which issued Mar. 11, 2003, which claims priority to U.S. Provisional Patent Application No. 60/231,825, entitled "A Multi-Bit Sigma-delta Digital to Analog Converter For Use in an Analog Front End in a DOCSIS Compatible Cable Modem," filed Sep. 11, 2000, and U.S. Provisional Patent Application No. 60/232,157, entitled "Multi-Bit Sigma-delta Digital to Analog Converter," filed Sep. 11, 2000, both of which are assigned to the assignee of the present invention, and both of which are incorporated herein by reference in their entirety.

FIELD OF THE INVENTION

The present invention relates generally to digital-to-analog converters, and more particularly, to digital-to-analog converters using sigma-delta modulators.

BACKGROUND OF THE INVENTION

A preferred technique for achieving accurate analog conversion of digital signals in digital-to-analog converters (DACs) is the noise-shaping technique. This technique makes use of digital signal processing to reduce the required accuracy and complexity of analog components, and by reducing the difficulty of design of these analog components. A noise-shaped sigma-delta DAC includes a digital sigma-delta modulator which quantizes an oversampled digital input signal to a small number of levels. The digital sigma-delta modultor shapes the quantization noise out of the passband of interest. The quantized digital output signal is converted to an analog signal and filtered using analog circuitry. The combination of digital noise shaping and analog filtering reduces the quantization noise to provide an accurate analog representation of the digital input signal.

Complicated linear analog filters are typically required at the output of the sigma-delta DAC to remove the out-of-band quantization noise. If these analog filters are not included then nonlinearities in the signal processing path following the sigma-delta DAC cause the out-of-band noise to intermodulate back into the passband. This reduces the dynamic range of the sigma-delta DAC. A preferred sigma-delta DAC implementation reduces the complexity and difficulty of design of these analog filters by reducing the sensitivity of the design to nonlinearities in analog signal components, and by reducing the required degree of filtering.

Digital sigma-delta modulators require oversampled data which is typically provided by an interpolator. The DAC's input data may be provided at the Nyquist rate and typically requires interpolation to a higher rate before being proficed to the sigma-delta modulator. The sigma-delta modulator is clocked using a high-speed digital clock, which is typically much faster than the input data rate provided to the interpolator. In general, noise present near multiples of these clock frequencies does not affect the analog output signal, because these frequencies are well beyond the passband of the signal of interest. However, this noise has a tendency to inter-modulate back into the passband when nonlinearities are present in the signal processing path following the sigma-delta DAC.

An exemplary prior art DAC 100 that uses a single bit sigma-delta modulator 142, is discussed with reference to FIG. 1. DAC 100 includes generally an interpolator 141, a sigma-delta modulator 142, and a mixed-mode digital/analog finite impulse response (FIR) filter 143. Interpolator 141 has an input terminal for receiving digital input data 102, a first clock input terminal for receiving a clock signal labeled "CLK1", a second clock input terminal for receiving a clock signal labeled "CLK2", and an output terminal for providing an n-bit output signal 104. Interpolator 141 receives digital input data 102 at a first sampling rate (the frequency of CLK1), and provides the n-bit output code 104 at the output thereof at a second, higher sampling rate (the frequency of CLK2) by performing an interpolation between the samples. Input data 102 may already be oversampled as well.

Single bit sigma-delta modulator 142 has an input terminal connected to the output terminal of interpolator 141, a clock input terminal for receiving signal CLK2, and an output terminal for providing output signal 106. Sigma-delta modulator 142 shapes the quantization noise in output signal 106 out-of-band, and thus, output signal 106 is a substantially accurate digital representation of input data 102 within the passband.

FIR filter 143 has an input terminal connected to the output terminal of sigma-delta modulator 142, and an output terminal for providing output signal 108. FIR filter 143 is single-bit, m-stage mixed-mode analog/digital filter that includes m delay elements each with a corresponding analog weighting. Representative delay elements 151, 152, and 153, and representative weighting amplifiers 161, 162, and 163 are illustrated in FIG. 1. Each delay element, labeled "$z^{-1}$", has an input terminal connected to a previous delay element, if any, and an output terminal. Amplifiers 161, 162, and 163 have inputs connected to outputs of corresponding delay elements 151, 152, and 153, outputs connected to corresponding positive inputs of a summing device 170, and multiply the inputs thereof to implement FIR filter coefficients labeled "h1", "h2", and "hm", respectively, associated therewith. The coefficient tap weights h1, h2 . . . hm can be set to give a specified frequency response. Analog summing device 170 sums the outputs of all the amplifiers and has an output terminal for providing analog output signal 108 therefrom. Further details of this prior art sigma-delta DAC 100 are described in U.S. Pat. No. 5,323,157, entitled "Sigma-Delta Digital-to-Analog Converter with Reduced Noise" (Ledzius et al.), which is incorporated herein by reference.

Conventional systems, such as the above described prior art DAC 100 suffer from numerous disadvantages. For example, single bit output 106 of sigma-delta modulator 142 has relatively high quantization noise before being filtered by analog FIR filter 143. Therefore, any noise on a reference signal, which could couple from clock frequencies and other high frequency signals, could easily modulate the quantization noise into the signal band.

For example, when the amplitude of the AC component of the digital input signal 102 is small, the quantization error signals within sigma-delta modulator 142 will tend to become periodic; that is, "idle tones" or "limit cycles" are produced. This is a well-known characteristic of sigma delta modulators. Detailed explanation of idle tones and limit cycles is, for example, provided in the book "Delta-Sigma Data Converters—Theory, Design and Simulation," Norsworthy et. al., IEEE Press, Piscataway, N.J. (1997), which is incorporated herein by reference. The idle tones with largest amplitude are typically produced at frequencies close to one-half of the sample frequency of sigma-delta modulator 142. There are two common causes for these idle tones to fold into the signal passband and degrade the performance of the sigma-delta modulator. One cause is due to interfering digital signals which couple onto the reference voltage for sigma-delta DAC 100. When these interfering digital signals couple onto the reference voltage they intermodulate with the high-frequency quantization noise and cause it to fold into the passband. For this reason sigma-delta DAC 100 is sensitive to coupled digital noise. The second common cause of for the idle tones to fold into the signal passband is due to nonlinearities in the signal processing path at the output of sigma-delta modulator 142. In the presence of these nonlinearities the idle tones typically intermodulate with each other, causing them to fold into the signal passband. Accordingly it would be desirable to filter out the quantization noise related to tones near fs/2.

Another disadvantage of the above described prior art is that the clock frequency of analog FIR filter 143 is the same as the clock frequency of the sigma-delta modulator 142 (i.e., CLK2). Since modulator 142 is highly oversampled in typical applications, analog FIR filter 143 (e.g., including analog summer 170) must operate at a very high clock frequency. Since it typically takes less power and design complexity to operate analog circuitry at lower frequencies, it would be desirable to lower the frequency at which filters and other circuitry must operate.

BRIEF SUMMARY OF THE INVENTION

The present invention is directed to a sigma-delta digital-to-analog converter (DAC). The sigma-delta DAC, according to an embodiment of the present invention, includes a digital-sigma delta modulator, a decimation filter, and a multi-bit DAC. The digital sigma-delta modulator receives a digital input signal and produces a quantized digital signal therefrom. The decimation filter receives the quantized digital signal and produces a decimated digital signal therefrom. The multi-bit DAC receives the decimated digital signal and produces an analog output signal therefrom. The analog output signal is representative of the digital input signal. As will be explained in more detail below, among other things, the decimation filter lowers the frequency at which filters and other circuitry (following the decimation filter) must operate.

In an embodiment of the present invention, the digital sigma-delta modulator includes a 2-level quantizer and the quantized digital signal is a single-bit digital signal. In another embodiment, the digital sigma-delta modulator includes a p-level quantizer (where p is an integer greater than 2), and the quantized digital signal is a multi-bit digital signal.

In an embodiment of the present invention, the decimation filter includes a multi-tap finite impulse response (FIR) filter (e.g., 3-tap digital FIR filter) and a decimator. The multi-tap FIR filter filters the quantized digital signal to produce a filtered signal including a sequence of sample values. Each sample value includes a plurality of bits. The decimator produces the decimated digital signal based on the sequence of sample values of the filtered signal.

According to a specific embodiment, the decimator discards one of every two sample values in the sequence of sample values of the filtered signal to produce the decimated digital signal. In this embodiment, the decimated digital signal has a sample frequency that is one half of a sample frequency of the filtered signal.

In an embodiment of the present invention, the multi-bit DAC includes k elements to be driven by a k-bit digital signal and produce k analog values therefrom, where the k-bit digital signal is representative of the decimated digital signal. A sum of the analog values from the k elements is representative of the digital input signal. Each of the k elements can be a current source that produces a respective one of the k analog values, with each of the k analog values being a current. In another embodiment, each of the k elements is a capacitor that produces a respective one of the k analog values, with each of the k analog values being a charge. Alternatively, each of the k elements is a resistor that produces a respective one of the k analog values, with each of the k analog values being a current. In an embodiment, the muti-bit DAC is a calibrated DAC.

According to an embodiment of the present invention, the k-bit digital signal is the decimated digital signal.

In an embodiment of the present invention, the decimated digital signal is a binary signal and the k elements of the multi-bit DAC are binary weighted elements.

In an embodiment of the present invention the multi-bit DAC includes a coder to receive the decimated digital signal and produce the k-bit digital signal therefrom. For example, if the decimated digital signal is an n-bit signal, the coder receives the n-bit decimated digital signal and produces the k-bit digital signal therefrom, where k may or may not equal n. The n-bit decimated digital signal can be a binary signal. In such an embodiment, the coder can be a binary-to-thermometer coder that converts the n-bit binary decimated digital signal to the k-bit digital signal, the k-bit digital signal being a thermometer coded signal.

In an embodiment of the present invention, the multi-bit DAC includes a mismatch shaping network to receive the decimated digital signal and produce the k-bit digital signal therefrom. In this embodiment, the k-bit digital signal is a shuffled signal.

In an embodiment of the present invention, the multi-bit DAC includes a coder and a mismatch shaping network. The coder receives the decimated digital signal and produces a coded signal therefrom. Then the mismatch shaping network receives the coded signal and produces the k-bit digital signal therefrom. The k-bit digital signal in this embodiment is a shuffled signal. In an embodiment, each of the k elements are substantially equally weighted.

According to an embodiment of the present invention, the multi-bit DAC includes an N-tap delay line and N multi-bit sub DACs, where N is greater than one. The N-tap delay line includes N multi-bit delay elements. A first of the N multi-bit delay elements receives a multi-bit digital signal representative of the decimated digital signal and produces a delayed multi-bit output signal therefrom. Each of the other N multi-bit delay elements receives a delayed multi-bit output signal from an immediately preceding one of the N multi-bit delay elements and produces a respective delayed multi-bit output signal therefrom. Each multi-bit sub-DAC is driven by a respective one of the delayed multi-bit output signals produced by a corresponding one the N multi-bit delay elements and produces an analog output therefrom. A sum of the analog outputs from the N multi-bit sub-DACs is representative of the digital input signal. In an embodiment of the present invention, each multi-bit sub-DAC includes k elements to be driven by a respective one of the delayed multi-bit output signals and produce k analog values therefrom. A sum of the analog values from the k elements corresponds to an analog output from one of the N multi-bit sub-DACs.

In an embodiment of the present invention, the multi-bit digital signal received by the first of the N multi-bit delay elements is the decimated digital signal. In this embodiment, the decimated digital signal can be, for example, a binary signal and each multi-bit sub-DAC can include binary weighted elements.

In an embodiment of the present invention, the multi-bit DAC further includes a coder to receive the decimated digital signal and produce the multi-bit digital signal therefrom. In this embodiment, the decimated digital signal can be an n-bit signal. The coder receives the n-bit decimated digital signal and produces the multi-bit digital signal therefrom. In this embodiment, the multi-bit digital signal being a k-bit digital signal, where k may or may not equal n. The n-bit decimated digital signal can be, for example, a binary signal. In such all embodiment, the coder can be a binary-to-thermometer coder that converts the n-bit binary decimated digital signal to the k-bit digital signal, the k-bit digital signal being a thermometer coded signal. Each multi-bit sub-DAC may include elements, with each of the k elements being substantially equally weighted.

According to an embodiment of the present invention, the multi-bit DAC further includes a mismatch shaping network to receive the decimated digital signal and produce the multi-bit digital signal therefrom. In this embodiment, the multi-bit digital signal is a k-bit shuffled digital signal.

In an embodiment of the present invention, the multi-bit DAC further includes a coder and a mismatch shaping network. The coder receives the decimated digital signal and produces a coded signal therefrom. The mismatch shaping network receives the coded signal and produces a k-bit shuffled digital signal therefrom. The k-bit shuffled digital signal is the multi-bit digital signal received by the first of the N multi-bit delay elements.

In an embodiment of the present invention, each multi-bit sub-DAC includes k elements that are each substantially equally weighted. Each sub-DAC may also include a coder and/or a mismatch shaping network.

The present invention is also directed to methods for converting a digital signal to an analog signal.

BRIEF DESCRIPTION OF THE DRAWINGS/FIGURES

These and other features, aspects, and advantages of the present invention will become better understood with regard to the following description, appended claims, and accompanying drawings where:

DETAILED DESCRIPTION OF THE INVENTION

I. Overview of the Present Invention

Figure 2:
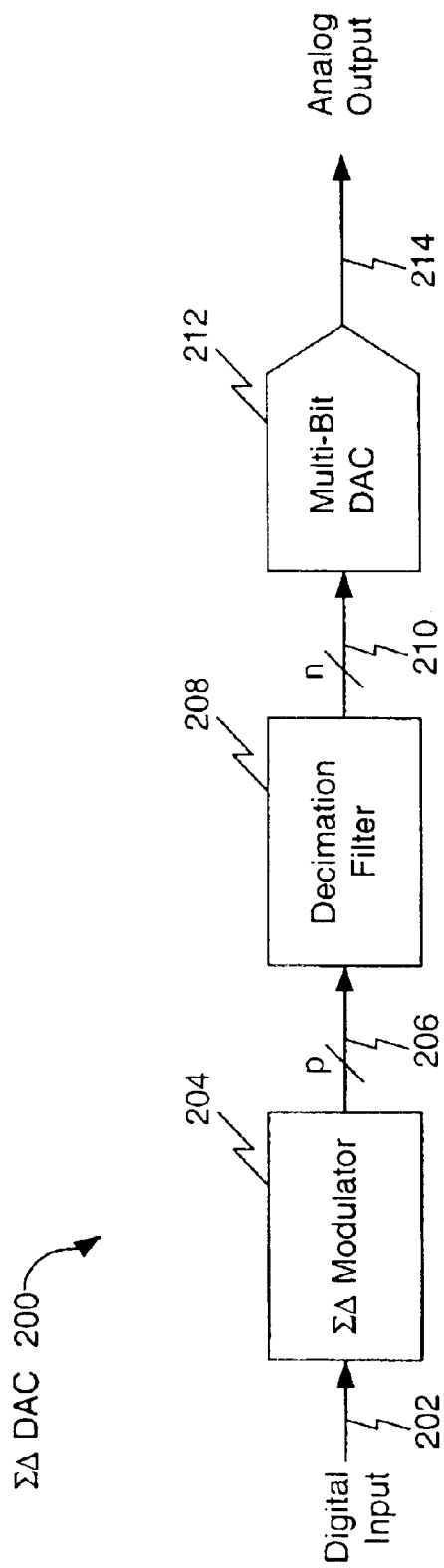
FIG. 2 is a high level block diagram a sigma-delta DAC, according to an embodiment of the present invention.

FIG. 2 is a high level block diagram a sigma-delta digital-to-analog converter (DAC) 200, according to an embodiment of the present invention. Sigma-delta DAC 200 includes a digital sigma-delta modulator 204, a decimation filter 208, and a multi-bit DAC 212. Digital sigma-delta modulator 204 receives a digital input signal 202 and produces a quantized digital signal 206 therefrom. Digital sigma-delta modulator 204 receives digital input signal 202, for example, from an interpolator (not shown). If digital input signal 202 is received from an interpolator, the interpolator may be considered part of digital-delta DAC 200. Decimation filter 208 receives quantized digital signal 206 and produces a decimated digital signal 210 therefrom. Additional details of an exemplary decimation filter, according to an embodiment of the present invention, are discussed below in connection with FIG. 3. Multi-bit DAC 212 receives decimated digital signal 210 and produces an analog output signal 214 therefrom. Additional details of an exemplary multi-bit DAC 212, according to various embodiments of the present invention are discussed below in connection with FIGS. 4–8. The analog output signal 214, produced by multi-bit DAC 212, is representative of digital input signal 202.

II. Digital Sigma-Delta Modulator

In an embodiment of the present invention, digital sigma-delta modulator 204 includes a 2-level quantizer. In this embodiment, quantized digital signal 206 is a single-bit digital signal.

In another embodiment of the present invention, digital sigma-delta modulator 204 includes an n-level quantizer, where n is an integer greater than one. In this embodiment, quantized digital signal 206 is a multi-bit digital signal.

Digital sigma-delta modulators are well known in the art. Accordingly, additional details of sigma-delta modulator 204 are not included.

III. Decimation Filter

Figure 3:
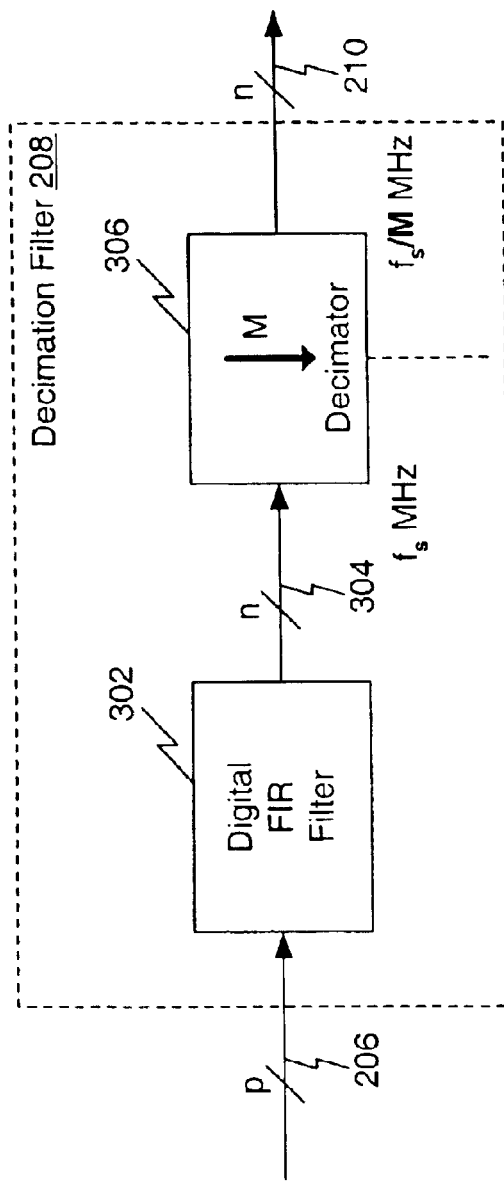
FIG. 3 is a block diagram that illustrates additional details of the decimation filter 208 of the sigma-delta DAC of FIG. 2, according to an embodiment of the present invention.

Additional details of an exemplary decimation filter 208, according to an embodiment of the present invention, shall now be discussed with reference to FIG. 3. As shown in FIG. 3, exemplary decimation filter 208 includes a multi-tap finite impulse response (FIR) filter 302 that filters quantized digital signal 206 to produce a filtered signal 304. Quantized digital signal 206 is shown as including p bits, where p is an integer equal to or greater than one. Filtered signal 304 is shown as including n bits, where n is typically greater than p. Filtered signal 304 includes a sequence of sample values, with each sample value including a plurality of bits. Multi-tap FIR filter 302 is, for example, a 3-tap digital FIR filter (e.g., $1+2z^{-1}+z^{-2}$). The purpose of multi-tap FIR filter 302 is to substantially filter out quantization noise near and around fs/M to prevent it from aliasing into the signal band during decimation (where fs is the sampling rate, and M, the decimation factor, is an integer greater than one). It is assumed in this process that only the lower-frequency information in signal 206 is important.

Decimation filter 208 also includes a decimator 306. Filtered (and preferably band-limited) signal 304 is provided to decimator 306 (also known as a sampling rate compressor). Decimator 306 produces decimated digital signal 210 based on the sequence of sample values of the filtered signal 304. Decimator 306 can accomplish this, for example, by discarding M−1 of every M samples (sampling rate compression) to produce decimated digital signal 210 at a rate fs/M that is free of aliasing. In an embodiment of the present inventions M=2. Accordingly, in this exemplary embodiment, the frequency of decimated signal 210 is fs/2. Stated another way, decimator 306 reduces the data rate fs of signal 304 (and thus, signal 206) by an integer factor M (e.g. M=2). In practice, the above described process can be performed by computing only one out of every M outputs of decimation filter 208 (e.g., computing 1 out of every 2 outputs of decimation filter 208).

Figure 1:
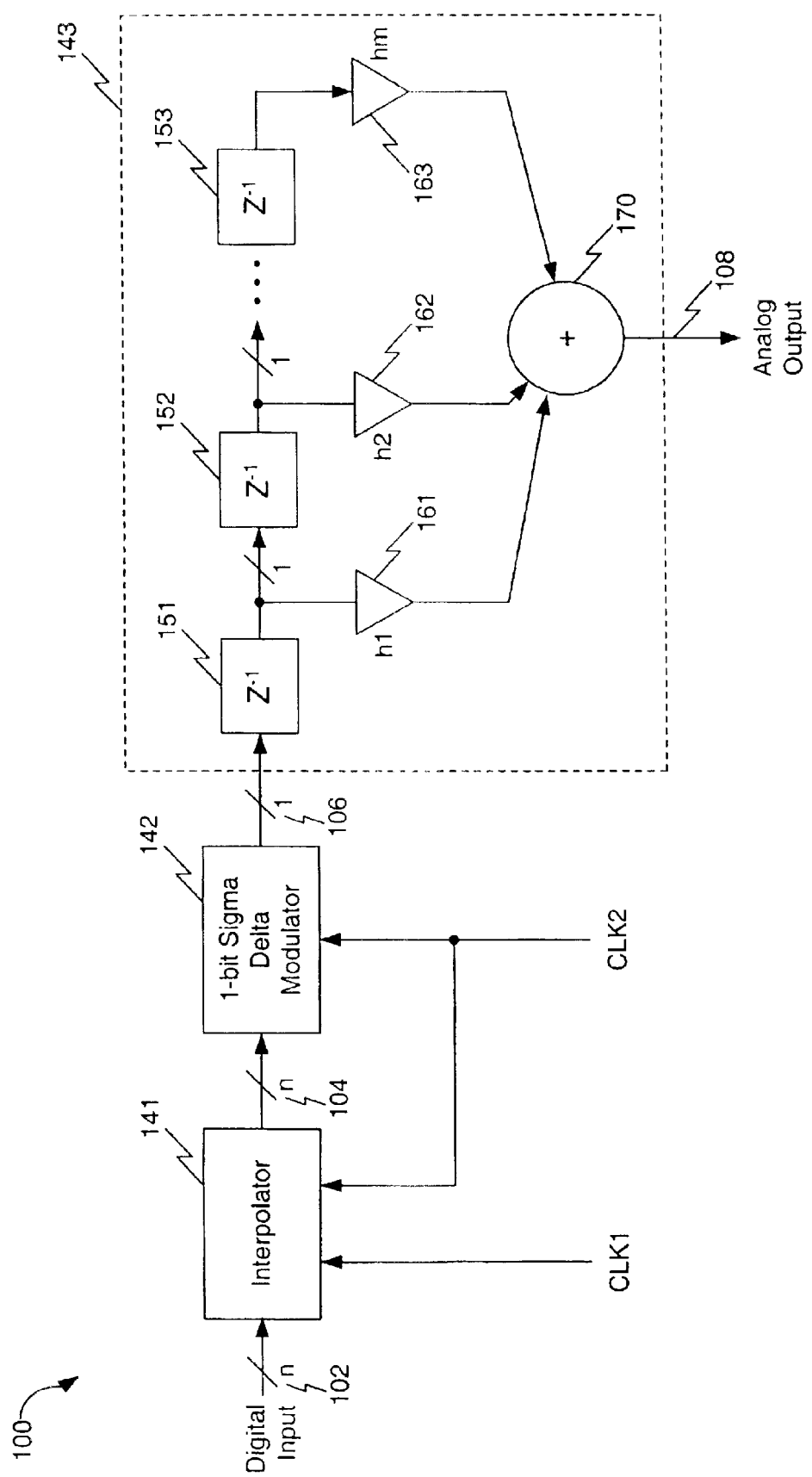
FIG. 1 illustrates a block diagram of a sigma-delta digital-to-analog converter (DAC) of the prior art.

Decimation filter 208 permits the use of lower frequency analog components following decimation filter 208 (i.e, the analog components in multi-bit DAC 212 and any analog filters following multi-bit DAC 212). For example, if the decimation factor is two (i.e., if M=2), then the analog clock frequency is halved. Depending upon the implementation of decimation filter 208, the increase of inband quantization noise due to aliasing of the noise near fs/M can be made small or negligible. This relaxes settling requirements of analog components without sacrificing inband quantization noise performance. In the prior art shown in FIG. 1, the sample rate of the analog FIR filter 143 is the same as the sample rate of the sigma-delta modulator 142. If the analog FIR filter frequency in the prior art were reduced by a factor of two, there would result a reduction in the oversampling ratio, and thus, an increase in the inband quantization noise. This is a significant difference because a decrease in oversampling by a factor of two, for example, in a second order sigma-delta modulator, would give a 15 dB higher quantization noise in the signal band.

IV. Multi-bit DAC

Additional details of an exemplary Multi-bit DAC 212, according to various embodiments of the present invention, shall now be discussed. In the embodiment shown in in FIG. 4, Multi-bit DAC 212 includes k elements 406, which are each shown as a small triangle. As will be described below, in some embodiments k equals n. In other embodiments, k does not equal n. In some embodiments, elements 406 are binary weighted elements. In other embodiments, elements 406 are unit elements (i.e., substantially equal weighted elements). Multi-bit DAC 212 is also shown as including an optional block 402, which is shown in dashed line. As will be explained below, optional block 402, if included, can perform one or more functions, or is omitted, depending on the embodiment.

Figure 4:
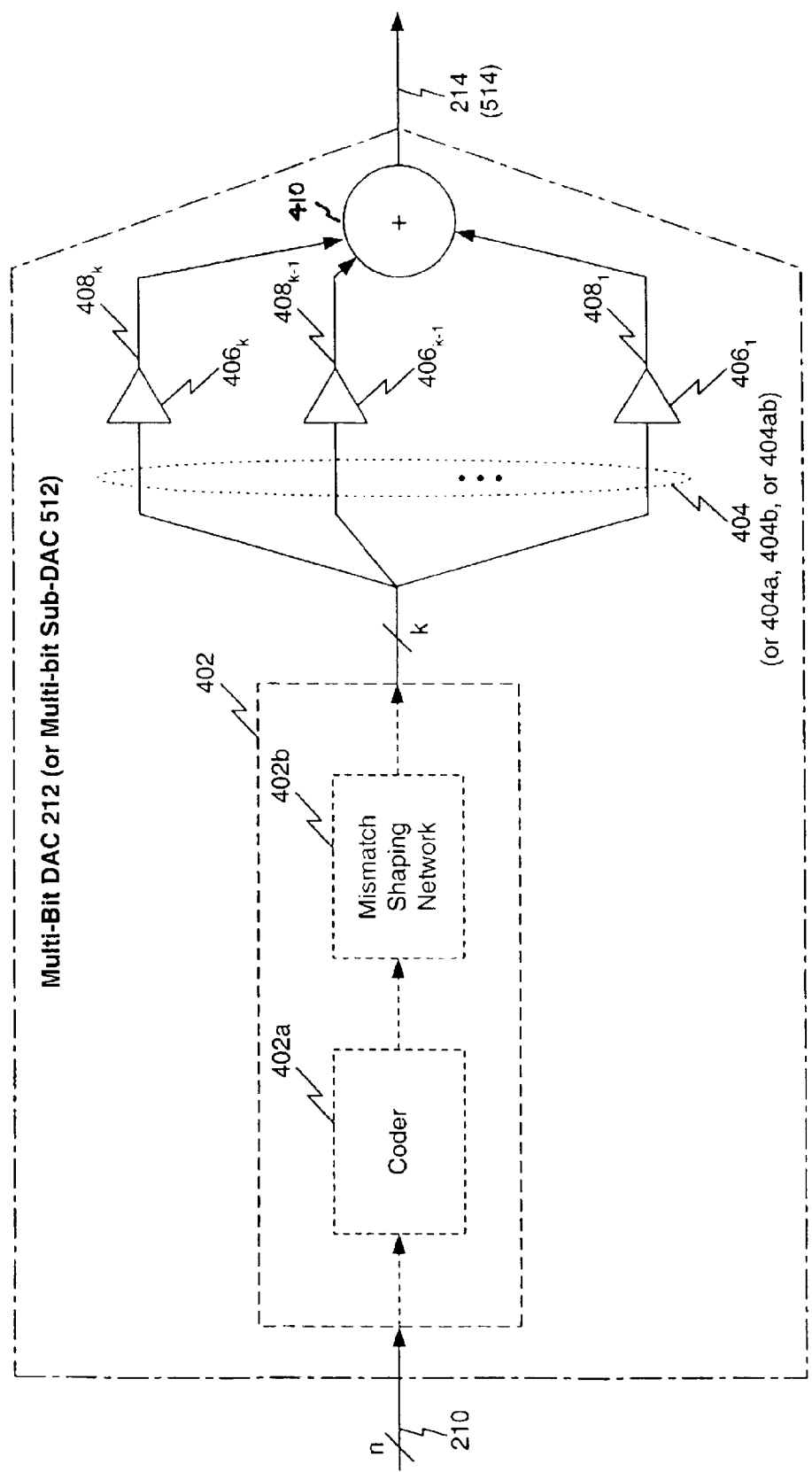
FIG. 4 is a block diagram that illustrates additional details of the multi-bit DAC 212 (or a multi-bit sub-DAC 512) of the sigma-delta DAC of FIG. 2, according to an embodiment of the present invention.

Referring to FIG. 4, in a first described embodiment, block 402 is omitted. More specifically, in this embodiment, a k-bit digital signal 404 (designated by an elliptic dashed line) is decimated digital signal 210. Decimated digital signal 210 can be, for example, an n-bit binary signal. In such an embodiment, decimated digital signal 210 is provided directly to k elements 406, and each of the k elements 406 is a binary weighted element. In this embodiment, k is equal to n. The k binary weighed elements are driven by the n-bit binary decimated digital signal 210 and produce k analog outputs 408 therefrom (remember k equals n in this embodiment). In an exemplary implementation, element $406_1$ receives the least significant bit (LSB) of k-bit digital signal 404 (i.e., decimated signal 210, in this embodiment), and element $406_k$ receives the most significant bit (MSB) of k-bit digital signal 404. Accordingly, element $406_1$ is the least weighted element, and element $406_k$ is the greatest weighted element. Each of the binary weighted elements $406_1$–$406_k$ produces a respective analog output (also referred to as an analog value) $408_1$–$408_k$. The sum of analog values $406_1$–$406_k$ produced by the k (i.e., n) binary weighted elements 406 is representative of the digital input signal 202.

Each of the k elements $406_1$–$406_k$ can be a current source that produces a respective one of the k analog values 408. In such an embodiment the k analog values are currents. Alternatively, each of the k elements $406_1$–$406_k$ can be a capacitor (e.g., of a switched capacitor array) that produces a respective one of the k analog values 408. In such an embodiment the k analog values are charges. In another embodiment, each of the k elements $406_1$–$406_k$ can be a resistor that produces a respective one of the k analog values 408. In such an embodiment the k analog values are preferably currents, but can be voltages. In further alternative embodiments the k elements are voltages sources and the k analog values are voltages. One of ordinary skill in the art would understand that the k analog values 408 can be summed in a variety of different ways (e.g. using summing device 410) to produce analog output signal 214. According to an embodiment of the present invention, multi-bit DAC 212 is a calibrated DAC.

In an embodiment of the present invention, multi-bit DAC 212 includes a coder 402a (also known as an encoder or decoder, depending on the specific implementation) to receive decimated digital signal 210 and produce the k-bit digital signal 404a therefrom. For example, assume decimated digital signal 210 is an n-bit signal. Coder 402a receives the n-bit decimated digital signal 210 and produces k-bit digital signal 404a therefrom, where k may or may not equal n, depending on the coding scheme. In an exemplary embodiment, the n-bit decimated signal 210 is a binary signal, and the k-bit digital signal 404a is a thermometer coded signal, which is described in more detail below with reference to Table 1. In such an embodiment, coder 402a is a binary-to-thermometer coder that converts n-bit binary decimated digital signal 210 to a k-bit digital signal 404a, where the k-bit digital signal 404a is a thermometer coded signal, and where k is greater than n.

In another embodiment, multi-bit DAC 212 includes a mismatch shaping network 402b to receive the decimated digital signal 210 and produce a k-bit shuffled digital signal 404b therefrom. In this embodiment, k may or may not equal n, depending on the specific implementation. Mismatch shaping network 402b performs mismatch shaping (also referred to as shuffling or scrambling) to randomize the effects element mismatches (of elements $406_1$–$406_k$) and/or move the effects of element mismatches to out of band frequencies. An exemplary mismatch shaping network 402b is disclosed in commonly assigned U.S. patent application Ser. Nos. 09/949,807 (Brooks et al.) and 09/949,815 (Brooks et al.), each entitled "Method and Apparatus for Mismatched Shaping of An Oversampled Converter," each of which was filed Sep. 12, 2001, and each of which is incorporated herein by reference. Alternative mismatch shaping networks 402b that can be used are described in the following U.S. Patent, each of which are incorporated herein by reference: U.S. Pat. No. 5,404,142 (Adams et al.), entitled "Data-Directed Scrambler For Multi-Bit Noise Shaping D/A Converters"; U.S. Pat. No. 5,406,283 (Leung), entitled "Multi-bit Oversampled DAC with Dynamic Element Matching"; and U.S. Pat. No. 5,684,482 (Galton), entitled "Spectral Shaping of Circuit Errors In Digital-to-Analog Converters." Mismatch shaping network 402b outputs a k-bit signal that is referred to as shuffled signal 404b. Shuffled signal 404b is provided to multi-bit DAC 212. Shuffled signal 404b, is also referred to as shuffled density signal, and is described below in more detail with reference to Table 1.

In another embodiment, multi-bit DAC 212 includes both a coder 402a and mismatch shaping network 402b. In such an embodiment, coder 402a receives decimated digital signal 210 and produces a coded signal therefrom. Mismatch shaping network 402b receives the coded signal and produces k-bit shuffled digital signal 404ab therefrom. Coder 402a and mismatch shaping network 402b can be implemented as separate functional blocks (as shown in FIG. 4), or may be combined into a single functional block.

In embodiments where k-bit digital signal 404 is either thermometer coded signal 404a or shuffled digital signal 404ab, each of the k elements 406 are preferably substantially equally weighted.

Figure 5:
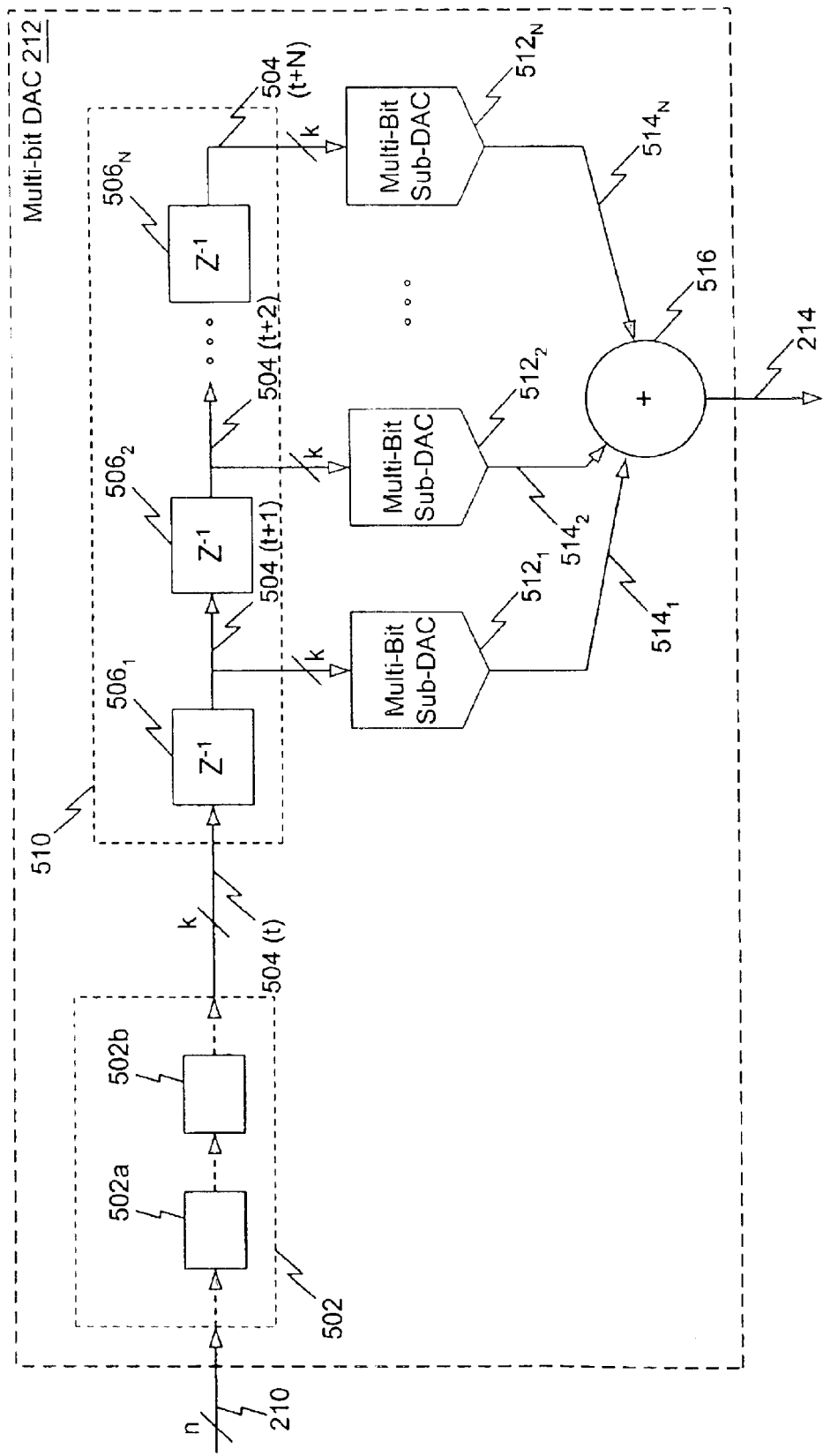
FIG. 5 is a block diagram that illustrates additional details of the multi-bit DAC 212 of the sigma-delta DAC of FIG. 2, according to an alternative embodiment of the present invention.

Referring now to FIG. 5, in alternative embodiments of the present invention, features of a finite impulse response (FIR) filter are incorporated into multi-bit DAC 212. More specifically, in an embodiment of the present invention, multi-bit DAC 212 includes an N-tap delay line 510 (shown by a dashed line) and N multi-bit sub-DACs $512_1$–$512_N$, as shown in FIG. 5. N-tap delay line 510 includes N multi-bit delay elements $506_1$–$506_N$ (each shown as a block labeled "$z^{-1}$"), where N is an integer greater than one. Additional details of multi-bit delay elements 506, according to an embodiment of the present invention, are described in connection with FIG. 6. Still referring to FIG. 5, a first of the N multi-bit delay elements (i.e., $506_1$) receives a multi-bit digital signal $504(t)$ representative of decimated digital signal 210 and produces a delayed multi-bit output signal $504(t+1)$ therefrom. Each of the other N multi-bit delay elements $506_2$–$506_N$ receives a delayed multi-bit output signal $504(t+i)$ from an immediately preceding one of the N multi-bit delay elements 506 and produces a respective delayed multi-bit output signal $504(t+i+1)$ therefrom. Each multi-bit sub-DAC 512 is driven by a respective one of the delayed multi-bit output signals $504(t+i)$ produced by a corresponding one the N multi-bit delay elements $506_i$, and produces an analog output $514_i$ therefrom. A sum of the analog outputs $514_1$–$514_N$ from the N multi-bit sub-DACs $512_1$–$512_N$ is analog output signal 214, which as mentioned above is representative of the digital input signal 202.

Referring back to FIG. 2, digital sigma-delta modulator 204 moves quantization noise out of the frequency band of interest. The FIR filter features e.g., of delay line 510 of multi-bit DAC 212, in the embodiments discussed with reference to FIG. 5, filter the out of band quantization noise to reduce the amplitude of the noise.

Referring back to FIGS. 4 and 5, in one embodiment, k-bit digital signal 404 is decimated digital signal 210. Alternatively, decimated digital signal 210 is first provided to a coder 502a (similar to coder 402a) and/or a mismatch shaping network 502b (similar to mismatch shaping network 402b). Accordingly, multi-bit digital signal $504(t)$ can be a coded and/or shuffled digital signal, similar to signal 404.

Each multi-bit sub-DAC 512 can include some or all of the features described in the discussion of FIG. 4. More specifically, referring to both FIGS. 4 and 5, in an embodiment of the present invention, each multi-bit sub-DAC $512_i$ includes k elements 406 that are driven by a respective one of the delayed multi-bit output signals $504(t+i)$ and produces k analog values (408) therefrom. In this embodiment, a sum of analog values 408 from k elements 406 (i.e., of one multi-bit sub-DAC 512) corresponds to the analog output $514_i$ from one of the N multi-bit sub-DACs $512_1$–$512_N$. Each of the k elements $406_1$–$406_k$, can be a current source, a capacitor, a resistor, or possibly a voltage source, as mentioned above in the discussion of FIG. 4.

In an embodiment of the present invention, each multi-bit sub-DAC $512_1$–$512_N$ includes a coder 402a to receive a respective one of the delayed multi-bit output signals 404a and produce a respective coded signal 404a therefrom. Coded signal 404a is used to drive k elements 406 within the multi-bit sub-DAC $512_i$, and produce k analog values 408 therefrom. A sum of the analog values 408 from the k elements 406 corresponds to an analog output $514_i$ from one of the N multi-bit sub-DACs $512_1$–$512_N$. The coder 402a within each of the multi-bit sub-DACs $521_1$–$512_N$ can convert an n-bit signal to a k-bit signal, in a similar manner discussed in connection with FIG. 4. For example, each delayed multi-bit output signal $504(t+i)$ can be an n-bit signal. Each coder 402a of each multi-bit sub-DAC $512_i$ receives a respective n-bit delayed multi-bit output signal $504(t+i)$ and produces a k-bit digital signal therefrom. In this embodiment, the k-bit digital signal is the coded signal 404a produced by the coder 402a.

Each coder 402a within each of the multi-bit sub-DACs $512_1$–$512_N$ can be, for example, a binary-to-thermometer coder that converts a respective n-bit delayed muti-bit output signal to a k-bit digital signal. In this embodiment, the k-bit digital signal is a thermometer coded signal.

In an embodiment of the present invention, each of the multi-bit sub-DACs $512_1$–$512_N$ includes a mismatch shaping network 402b to receive a respective one of the delayed multi-bit output signals $504(t+i)$ and produce a respective k-bit shuffled signal 404b therefrom. The k-bit shuffled signal 404b drives k elements 406, within the multi-bit sub DAC $512_i$, producing k analog values 408 therefrom. Referring to FIG. 5, a sum of the k analog values 408, from the k elements 406, corresponds to an analog output 514, from one of the N multi-bit sub-DACs $512_1$–$512_N$.

In an embodiment of the present invention, each of the multi-bit sub-DACs $512_1$–$512_N$ includes a coder 402a and a mismatch shaping network 402b. Coder 402a receive a respective one of the delayed multi-bit output signals 504 (t+i) and produces a respective coded signal therefrom. Mismatch shaping network 402b receives the coded signal and produces a respective k-bit shuffled signal 404ab therefrom. The k-bit shuffled signal 404ab drives k elements 406 to produce k analog values 408 therefrom. A sum of the analog values 408 from the k elements 406 corresponds to an analog output $514_i$ from one of the N multi-bit sub-DACs $512_1$–$512_N$. In an embodiment, each of the k elements are substantially equally weighted (i.e., are unit elements).

Figure 6:
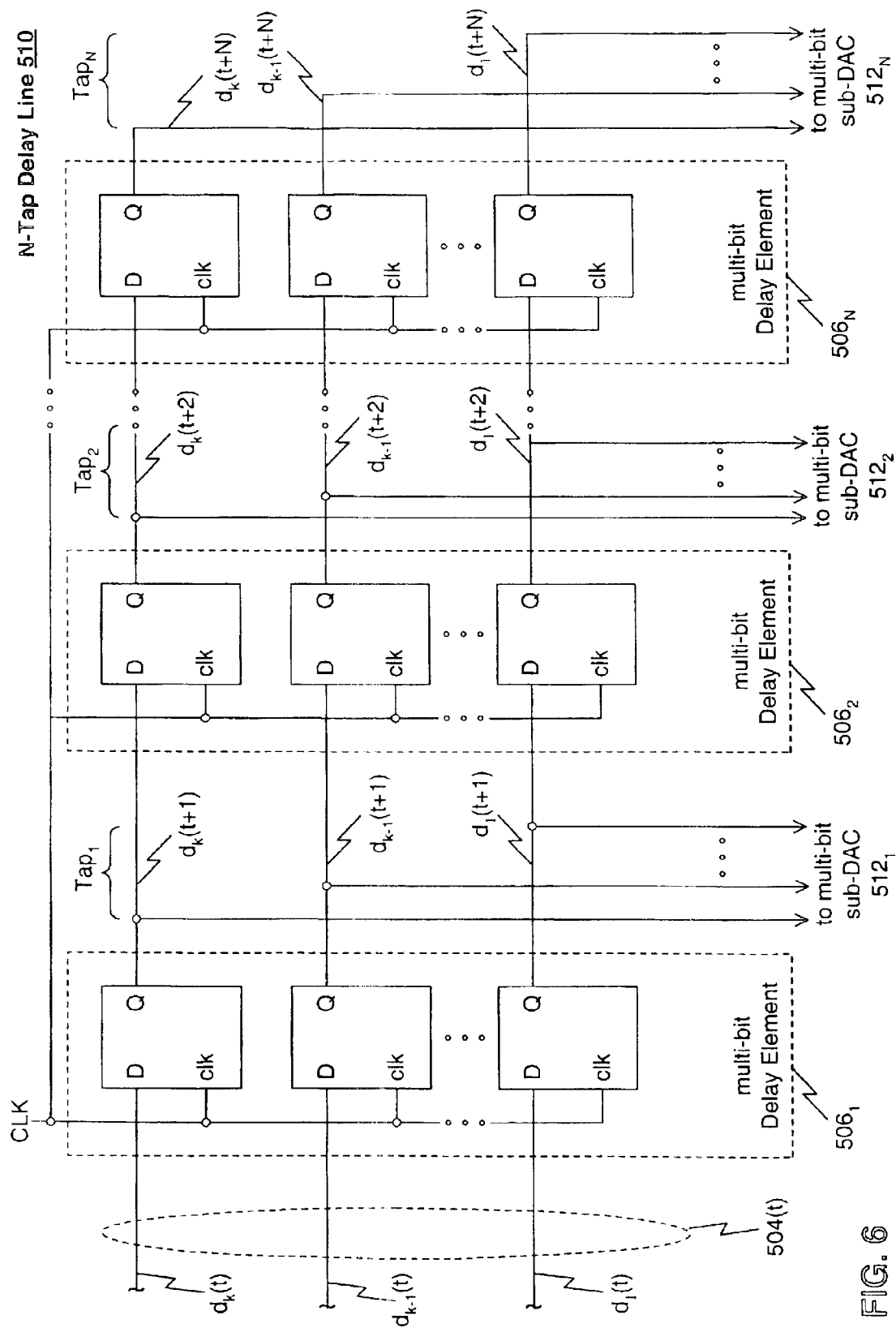
FIG. 6 is a block diagram that illustrates additional details of the delay line 510 of the multi-bit DAC shown in FIG. 5, according to an embodiment of the present invention.

FIG. 6 illustrates additional details of delay line 510, according to an embodiment of the present invention. In this embodiment, each of the delay element $506_1$–$506_N$ includes k D-type flip-flops. An output (of pin Q) of each of the flip-flops in the first delay element $506_1$ is provided to an input (pin D) of a corresponding flip-flop in the second delay element $506_2$. Each flip-flop also receives clock signal CLK, which has a frequency fs/M. Each flip-flop delays a bit of k-bit digital signal $504(t)$ by a period of the clock signal CLK. The output (of pin Q) of each of the flip-flops of first delay element $506_1$ is also provided to a corresponding multi-bit sub-DAC $512_1$. The other multi-bit delay elements $506_2$–$506_N$ receive outputs from flip-flops in the immediately preceding one of the multi-bit delay elements 506 and produce respective delayed outputs therefrom in a similar manner.

Figure 7:
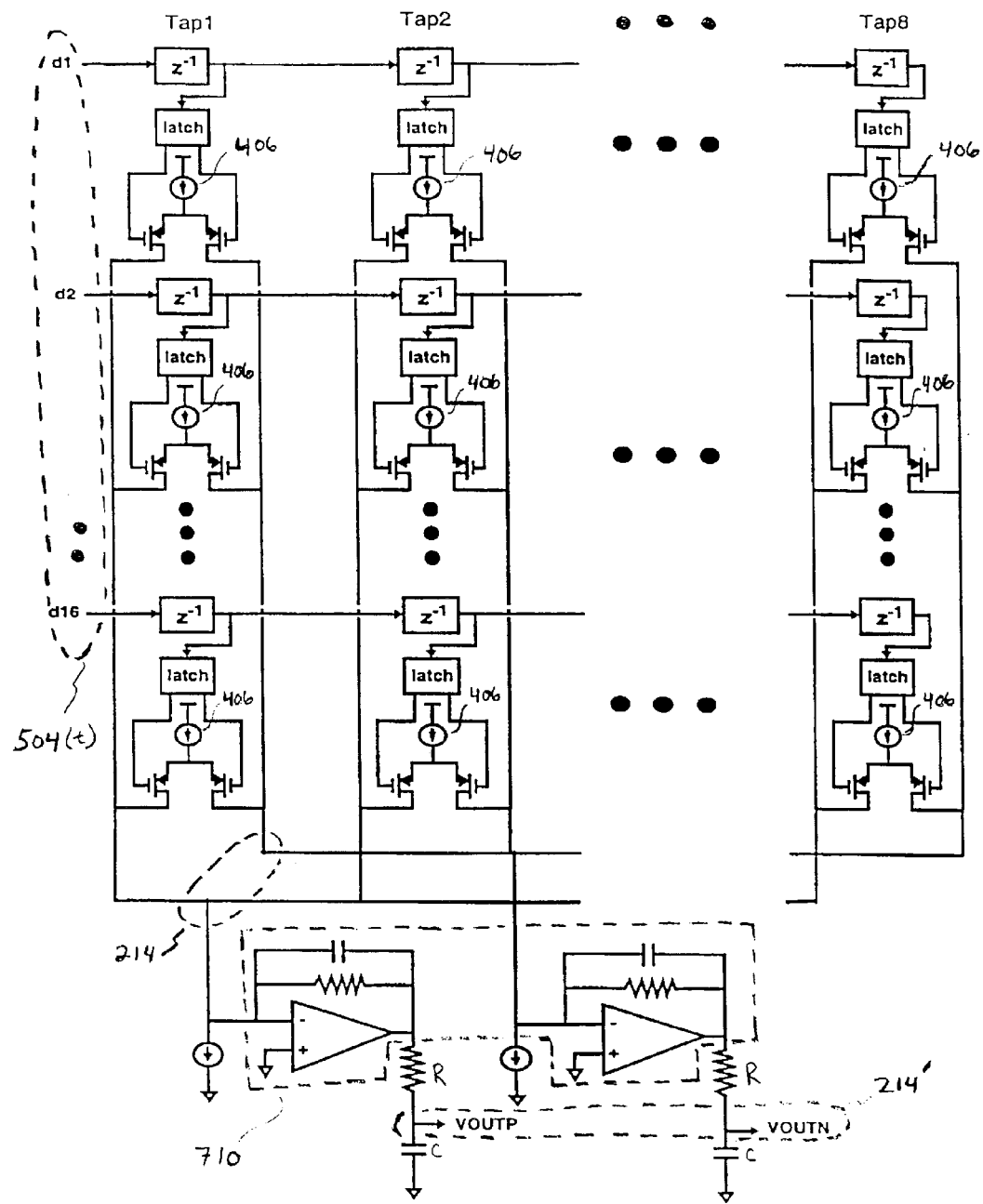
FIG. 7 illustrates an exemplary implementation of a multi-bit DAC 212 including a digital delay line.

FIG. 7 illustrates an exemplary implementation of a multi-bit DAC 212 including a digital delay line. In this embodiment, the digital delay line is created from sixteen banks of eight series connected delay elements, each labeled "$z^{-1}$". For example, each delay element can be a flip-flop, and the delay line can be created from sixteen banks of eight series connected flip-flops. The resulting eight-tap boxcar filter reduces the amount of external filtering required to remove the high frequency quantization noise produce by digital sigma-delta modulator 204 (shown FIG. 2). In this embodiment, each of the elements 406 is a current source. More specifically, the multi-bit DAC 212 shown in FIG. 7 includes 8 taps, with each tap including 16 current source 406 that can either be turned positive or negative. Each current source 406 produces a differential current output. The currents are then summed to produce differential analog output signal 214, which is a current. In this embodiment, analog output signal 214 is converted to a differential voltage signal 214' using a transimpedance amplifier 710.

A single pole RC filter consists of resistors R (e.g., on-chip resistors) at the outputs (VOUTP and VOUTN) of transimpedanice amplifier 710 and capacitors C (e.g., exter-nal capacitors). The combination of the eight-tap boxcar filter and the single pole RC filter provides sufficient filtering for a 75 dB dynamic range while integrating the multi-bit DAC quantization noise from DC to fs/2 (e.g., 6.144 MHz), assuming the decimation factor M equals 2.

V. Exemplary Coder

A coder is a device that converts digital words of a digital signal from one digital format to another digital format. For example, as mentioned above, a coder may convert a binary coded signal to a thermometer coded signal. Such an exemplary coder is referred to as a binary-to-thermometer coder. An n−1 bit thermometer code is required to represent n possible binary values, as will be clear from Table 1 below. The first row of Table 1 includes the five possible values of a binary coded word between binary "000" (decimal 0) and binary"100" (decimal 4). Thus, as shown in Table 1, four bits are required for the thermometer codes in the second column.

A thermometer code is a type of density code. A "density code" refers to a word in which the density of the word (not the specific order) indicates the value of the signal (thus, a binary coded word is not a density coded word). More specifically, the "density" of a word specifies how many of the bits in the word are a specific bit or logic value (i.e., logic one). Four bit words will be used to explain this concept. A four bit word can have a density of zero, ¼th, ½, ¾th or one. More specifically, the four bit word "0000" has a density of 0/4th (i.e., zero). The four bit words "0001", "0010", "0100" and "1000", each have a density of ¼th. The foul bit words "0011", "0110", "11100", "1001", "1010" and "0101", each have a density of 2/4th (i.e., ½). The four bit words "1110", "1101", "1011" and "0111", each have a density of ¾th. The four bit word "1111" has a density of 4/4th (i.e. one).

A specific type of density code is a "thermometer code". A thermometer coded is a density code having a specific order (but it is still the density, not the order that specifies its value). The term "thermometer" code is used because when visualizing the code it increases in value much like a thermometer increases in value. The second column of Table 1 illustrates the thermometer code words that correspond to the binary code words in the first column. That is, the second column represents the output of a binary-to-thermometer coder.

The third Column of Table 1 specifies the density of the thermometer codes in the second column. The fourth (i.e., last) column of Table 1 includes density codes that can be generated from the thermometer codes in the third column, e.g., by shuffling the thermometer codes using a mismatch shaping network.

TABLE 1

| Binary Input (e.g.. to a Binary-to-Thermometer Coder) | Thermometer Output (e.g., from a Binary-to-Thermometer Coder) | Density of Thermometer Output | Possible Density Codes that Can be Produced by Shuffling the Thermometer Code (i.e., Shuffled Density Codes) |
| --- | --- | --- | --- |
| 000 | 0000 | 0 | 0000 |
| 001 | 0001 | ¼th | 0001, 0010, 0100, 1000 |
| 010 | 0011 | 2/4th | 0011, 0110, 1100, 1010, 0101, 1001 |
| 011 | 0111 | ¾th | 0111, 1011, 1101, 1110 |
| 100 | 1111 | 4/4th | 1111 |

The above discussion has been provided to help the reader under stand the terms "coder", "thermometer code", "density code" and "shuffled code." A binary-to-thermometer coder is only one example of a coder that can be used with the present invention. However, the present invention is not meant to be limited to this type of coder.

VI. Exemplary Mismatch Shaping Network

Figure 8:
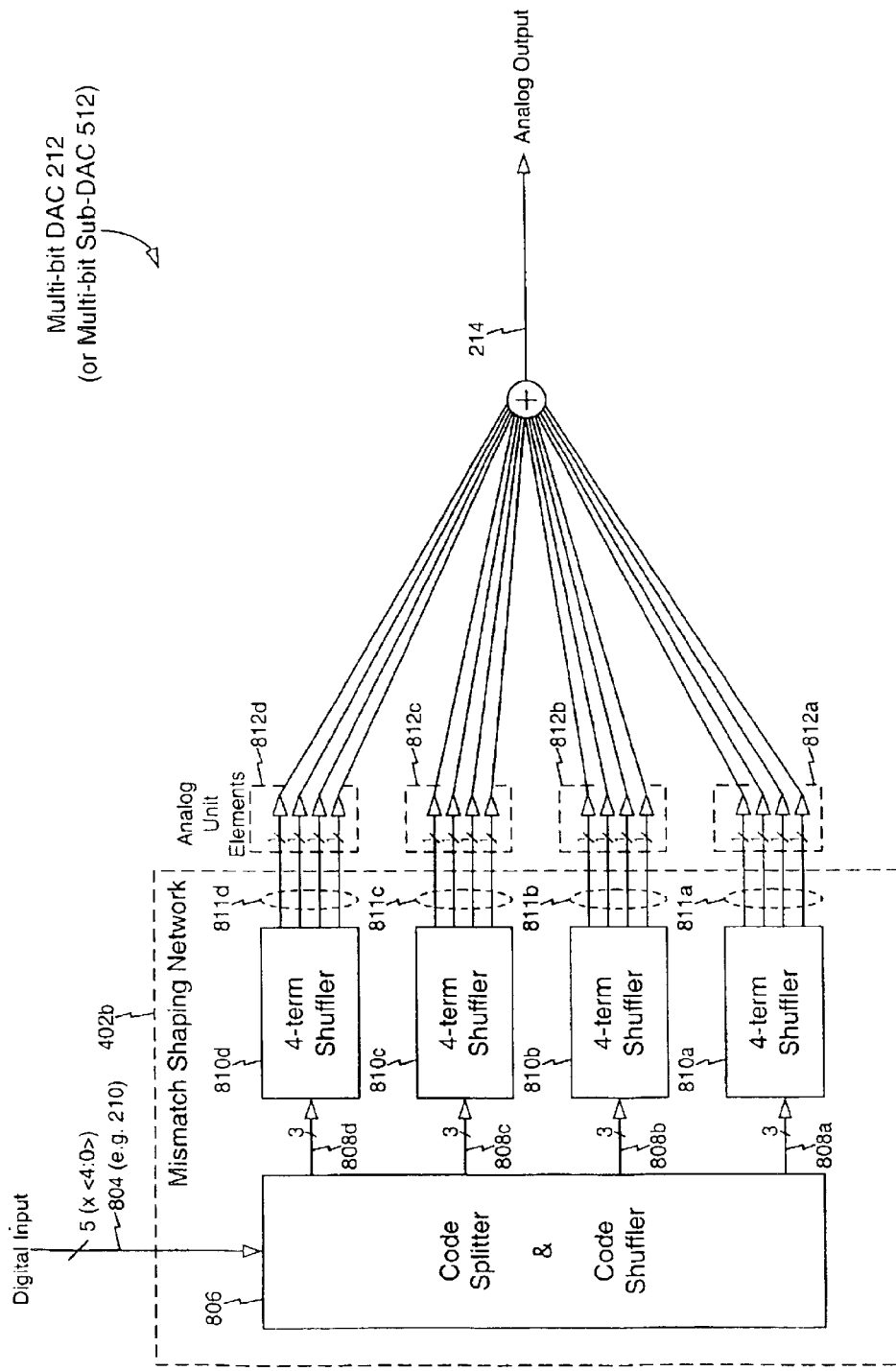
FIG. 8 is a block diagram of a multi-bit sigma-delta DAC 212 (or multi-bit sub-DAC 512) that includes a mismatch shaping network, according to an embodiment of the present invention.

Additional details of an exemplary mismatch shaping network 402b (or 502b), according to an embodiment of the present invention, shall now be explained with reference to FIG. 8. FIG. 8 shows a block diagram of a multi-bit sigma-delta DAC 212 (or multi-bit sub-DAC 512) that includes a mismatch shaping network 402b. According to an embodiment of the present invention, mismatch shaping network 402b includes a code splitter & code shuffler (CSCS) 806, and four separate shufflers 810a, 810b, 810c and 810d. Multi-bit sigma-delta DAC 212 receives a digital signal 804 (e.g., decimated digital signal 210, or a coded version of the same) and converts it to an analog output signal 214 representative of the digital signal 804 (and also representative of digital input signal 202).

A shuffler is hereafter defined as a block which receives a digital input signal and produces an output digital density signal in which the order of the ones and zeros in the output digital density signal is not correlated to the digital input signal (and thus, the outputs of shufflers are also referred to as shuffled density codes). For example one common implementation of a shuffler is a dynamic element mismatch circuit. This type of shuffler implementation typically includes one or more memory elements to track the order of the ones and zeros produced previously in the output digital density signal. Another shuffler implementation either includes a pseudo-random sequence generator to generate a pseudo-random sequence or it receives a pseudo-random sequence. In this second shuffler implementation the pseudo-random sequence is used to randomize the location of the ones and zeros in the output digital density sequence. A shuffler may also use a combination of dynamic element mismatch circuitry and a pseudo random sequence to ensure that the order of, the ones and zeros in the output digital density signal is not correlated to the digital input signal.

Referring back to FIGS. 2 and 4, CSCS 806 can for example receive decimated digital signal 210 from decimation filter 208 or a coded version of the same from coder 402a. Each digital word of digital signal 804 (e.g., decimated digital signal 210, or a coded version of the same) shall often be referred to herein as a digital input code, or simply as an input code 804. For this example, it is assumed that each digital input code is a 5-bit binary coded word that can be one of seventeen levels (e.g., from binary 00000 to binary 10000).

Referring again to FIG. 8, in this exemplary embodiment CSCS 806 splits each digital input code into four sub-codes 808a, 808b, 808c and 808d (also referred to collectively as a "set of sub-codes"), and provides each of the four sub-codes 808a, 808b, 808c and 808d to one of the four separate shufflers 810a, 810b, 810c and 810d. CSCS 806 (also referred to simply as "splitter 806") splits input code 804 into the foul sub-codes 808a, 808b, 808c and 808d as equally as possible (i.e., each of the four sub-codes is no more than one level different than the other sub-codes). The sum of the four sub-codes 808a, 808b. 808c and 808d (i.e., the sum of the set of sub-codes) is equal to digital input code 804. The way (i.e., order) codes are split is dependent on the incoming digital input code 804 as well as on one or more memory elements that tracks how that particular code was previously split. A particular sub-code is preferably cycled to each of the multiple shufflers 810a, 810b, 810c and 810d to implement mismatch shaping at the sub-code level.

As mentioned above, each input code 804 is as equitably split as possible into four sub-codes 808a, 808b, 808c and 808d. For example, an incoming code of seven may initially be split into four sub-codes 2, 2, 2, 1, where 2+2+2+1=7 (notice that each of the four sub-codes is not different than any of the other three sub-codes by more than one level). In addition, the first sub-code of 2 may initially be assigned to first shuffler 810a. Similarly, the second sub-code of 2 may initially be assigned to second shuffler 810b, the third sub-code of 2 may initially be assigned to third shuffler 810c, and the last sub-code of 1 may be initially assigned to fourth shuffler 810d. The next time a code of seven is input into splitter 806 it may be split into 2+2+1+2, the next time 2+1+2+2, and the next time 1+2+2+2. No memory elements are needed for an input code of eight, since each of the foul shufflers will always be assigned a value of two.

Table 2 is a splitter sub-code table illustrating the way splitter 806 may split digital input code 804 into four separate sub-codes. The first column of Table 2 identifies the possible values of digital input code 804. As can be seen from the table, digital input code 804 in this example is a seventeen level code. The next four columns of Table 2 specify the members of the sub-code sets that correspond to the input codes in the first column. For example, the sub-code set corresponding to an input code of seven includes values 2, 2, 2 and 1, as mentioned above. The last column of Table 2 lists the total number of different sub-code combinations that can be produced when an input code is split. For example, as mentioned above an incoming code of seven can be split into four sub-code combinations, 2+2+2+1, 2+2+1+2, 2+1+2+2 and 1+2+2+2. Notice that for each input code, the members of the corresponding sub-code set remain the same. Only the sub-code order associated with the set changes. Accordingly, a sub-code "combination" can thought of as a sub-code set associated with a sub-code order. Thus, the last column of Table 2 can be thought of as specifying the number of different sub-code orders that can be associated with a sub-code set. Preferably, on average, each sub-code order occurs substantially the same number of times for a given input code.

In another example, an incoming code of six can be split into four sub-codes with six different combinations, namely, 2+2+1+1, 2+1+1+2, 1+1+2+2, 2+1+2+1, 1+2+1+2 and 1+2+2+1. Therefore, if an input code of six appears six times in a row, the splitter may cycle through all the available combinations. However, this may not be necessary because the inventors have determined that for each digital input code 804 having six available combinations (i.e., inputs codes 2, 6, 10 and 14, as shown in Table 2), sufficient mismatch shaping performance is achieved using just four of the six possible combinations. This can simplify the implementation of splitter 806.

TABLE 2

Splitter Sub-code Table

| Input Code (binary) | Sub-code 1 | Sub-code 2 | Sub-code 3 | Sub-code 4 | # of Combinations |
|---|---|---|---|---|---|
| 16 (10000) | 4 | 4 | 4 | 4 | 1 |
| 15 (01111) | 4 | 4 | 4 | 3 | 4 |
| 14 (01110) | 4 | 4 | 3 | 3 | 6 |
| 13 (01101) | 4 | 3 | 3 | 3 | 4 |
| 12 (01100) | 3 | 3 | 3 | 3 | 1 |
| 11 (01011) | 3 | 3 | 3 | 2 | 4 |
| 10 (01010) | 3 | 3 | 2 | 2 | 6 |
| 9 (01001) | 3 | 2 | 2 | 2 | 4 |
| 8 (01000) | 2 | 2 | 2 | 2 | 1 |
| 7 (00111) | 1 | 2 | 2 | 2 | 4 |
| 6 (00110) | 1 | 1 | 2 | 2 | 6 |
| 5 (00101) | 1 | 1 | 1 | 2 | 4 |
| 4 (00100) | 1 | 1 | 1 | 1 | 1 |
| 3 (00011) | 0 | 1 | 1 | 1 | 4 |
| 2 (00010) | 0 | 0 | 1 | 1 | 6 |
| 1 (00001) | 0 | 0 | 0 | 1 | 4 |
| 0 (00000) | 0 | 0 | 0 | 0 | 1 |

In the described exemplary embodiment, sub-codes 808a, 808b, 808c and 808d are converted to shuffled density codes by shufflers 810a, 810b, 810c and 810d. At each shuffler 810a, 810b, 810c and 810d, the individual sub-code is preferably shuffled using a combination pseudo random dithering and shuffling. An exemplary implementation of shufflers 810, according to an embodiment of the present invention, is in more detail in U.S. patent application Ser. Nos. 09/949,807 (Brooks et al.), and 09/949,815 (Brooks et al.), each entitled "Method and Apparatus for Mismatched Shaping of An Oversampled Converter," each of which was incorporated by reference above.

In the described exemplary embodiment, the four shufflers 810a, 810b, 810c and 810d process each of the sub-codes 808a, 808b, 808c and 808d. More specifically, each of the shufflers (e.g., 810a) shuffles one of the four sub-codes (e.g., 808a) to produce a four-bit shuffled density code (e.g., 811a) made up of four separate 1-bit outputs. Each of the four separate 1-bit outputs, which is either HIGH or LOW, is provided to an analog unit element (i.e., elements 408). Each analog unit element is shown as a triangle in FIG. 8. Each group of four analog unit elements can be thought of as a four element sub-DAC 812. Sub-DACs 812a, 812b, 812c and 812d are nominally identical multi-level sub-DACs that have non-ideal gain and offset. The outputs (811*a*, 811*b*, 811*c* and 811*d*) of each shuffler 810*a*, 810*b*, 810*c* and 810*d* drives one of the four separate four element sub-DACs 812*a*, 812*b*, 812*c* and 812*d*.

The various sub-code combinations produced by CSCS 806 has the effect of moving the in-band component of error energy due to the effect of gain mismatch errors in sub-DACs 812*a*, 812*b*, 812*c*, and 812*d* to out-of-band frequencies. CSCS 806 either provides mismatch shaping of mismatch errors between sub-DACs, or it whitens the error energy resulting from mismatch errors between sub-DACs and spreads the error energy throughout the frequency band from DC to fs/2 (where fs represents the sample rate of the sub-DACs). This substantially reduces the component of in-band error energy due to mismatch between the sub-DACs. The four-term shufflers 810*a*, 810*b*, 810*c*, and 810*d* either provide mismatch shaping of element mismatch errors within each sub-DAC, or they whiten the error energy resulting from mismatch errors between elements in each sub-DAC and spread the error energy throughout the frequency band from DC to fs/2. This substantially reduces the component of in-band error energy due to mismatch errors between elements in each sub-DAC. The combination of CSCS 806 and shufflers 810*a*, 810*b*, 810*c*, and 810*d* is to reduce the in-band component of all the error energy associated with mismatch errors in sub-DACs 812*a*, 812*b*, 812*c*, and 812*d*.

In the example embodiment shown in FIG. 8, there are sixteen (16) analog unit elements (shown as triangles) being driven (i.e., flipped or switched). When the input to an analog unit element is HIGH, the analog unit element will output a first analog value, and the element is considered ON (i.e., flipped or switched on). When the input to an analog unit element is LOW, the analog unit element will output a second analog value, and the element is considered OFF (i.e., flipped or switched off). The plurality of elements are said to be "mismatched" if each of the plurality of unit elements does not output the exact same first and second analog values as the other unit elements. Mismatch shaping network 402*b* performs mismatch shaping to overcome or compensate for such mismatch.

As shown in FIG. 8, the outputs of the sixteen (16) analog unit elements are added together, for example, on a wire, to produce an analog output 214 that is representative of the digital input 804 (and digital input signal 202). In this example, each of the unit elements (shown as triangles) are evenly weighted such that if the elements were perfectly matched, then the first analog value associated with each of the elements would be equal, and the second analog value associated with each of the elements would be equal. Accordingly, in this exemplary embodiment, analog output 814 can have one of seventeen (17) different states (also referred to as levels or values). For example, the first level is when none of the sixteen elements are ON, the second level is when only one of the sixteen elements are ON, the third level is when two of the sixteen elements are ON, . . . and the seventeenth level is when all sixteen elements are ON. Five (5) binary bits are required to represent the seventeen different levels (even though five binary bits can represent up to thirty two levels). In the exemplary embodiment disclosed, digital input 804 is a seventeen level unsigned binary input. Accordingly, digital input 804 is shown as a five (5) bit binary word that can have a value between binary 00000 (decimal zero) and binary 10000 (decimal 16). If only sixteen (16) of the seventeen (17) possible states were utilized, then digital input 804 need only include four (4) binary bits that can have a value between binary 0000 (decimal zero) and binary 1111 (decimal 15).

One of ordinary skill in the art should appreciate that digital input signal 804 can alternatively be a signed binary input. One or ordinary skill in the art should also appreciate that digital input signal 804 need not be a binary signal.

The above described exemplary embodiment of the mismatch shaping network is shown as splitting a digital input code into four sub-codes, which are each provided to one of four separate shufflers. However, one of ordinary skill in the art will appreciate that a digital input code can be split into a different number of sub-codes (i.e., other than four). Preferably, the digital input code is split into more than two sub-codes. A shuffler should be provided for each sub-code. For example, if the digital input code is split into three sub-codes, then three shufflers should be used. One of ordinary skill in the art will also appreciate that shufflers other than 4-term shufflers can be used. Additional details of the mismatch shaping network 402*b* shown in FIG. 8, are provided in U.S. patent application Ser. Nos. 09/949,807 (Brooks et al.) and 09/949,815 (Brooks et al.), each entitled "Method and Apparatus for Mismatched Shaping of An Oversampled Converter," each of which was incorporated by reference above.

As mentioned above, other mismatch shaping networks that can be used are disclosed in U.S. Pat. No. 5,404,142 (Adams et al.), U.S. Pat. No. 5,406,283 (Leung), U.S. Pat. No. 5,684,482 (Galton), each of which were incorporated by reference above. One of ordinary skill in the art would recognize that any mismatch shaping network or dynamic element mismatch circuit may be used to implement mismatch shaping network 402*b*.

VII. Frequency Spectrum Plots

Figure 9A:
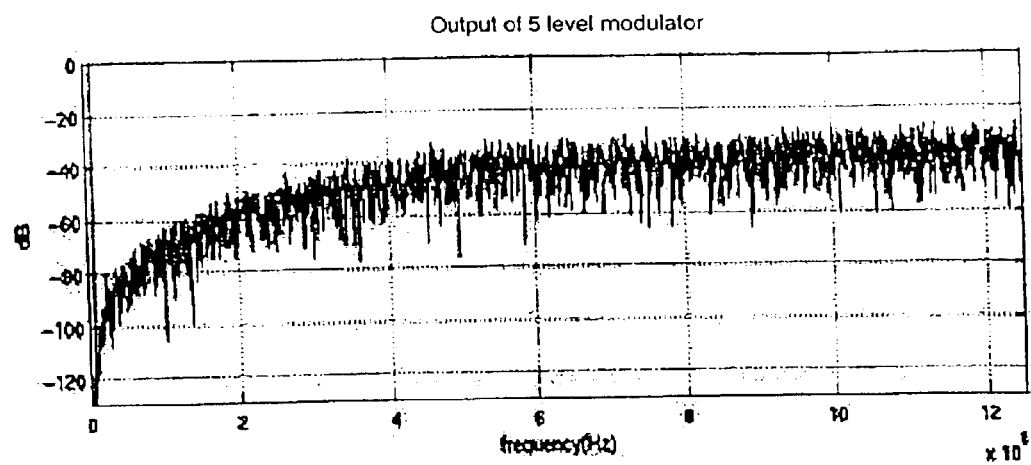
FIGS. 9A–9E are exemplary frequency spectrum plots that show the frequency spectrum at various stages of a sigma-delta DAC 212 of an embodiment of the present invention.
Figure 9B:
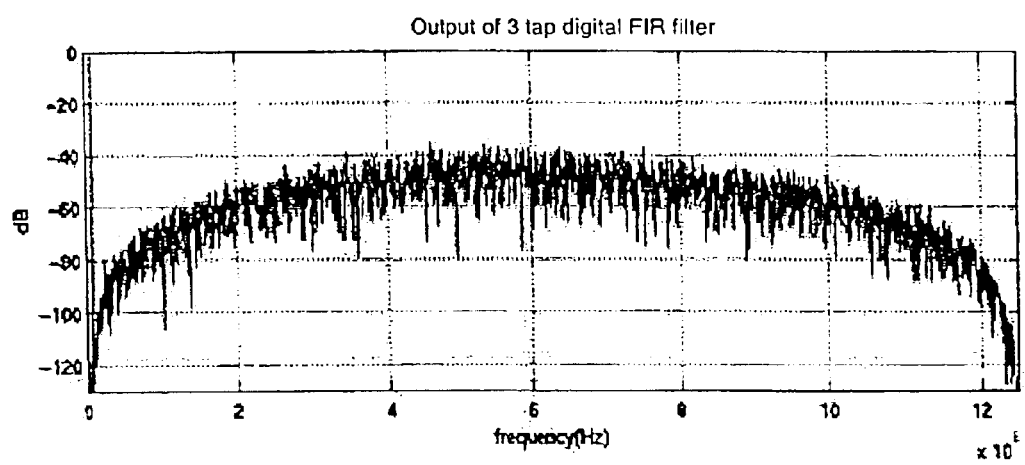
Figure 9C:
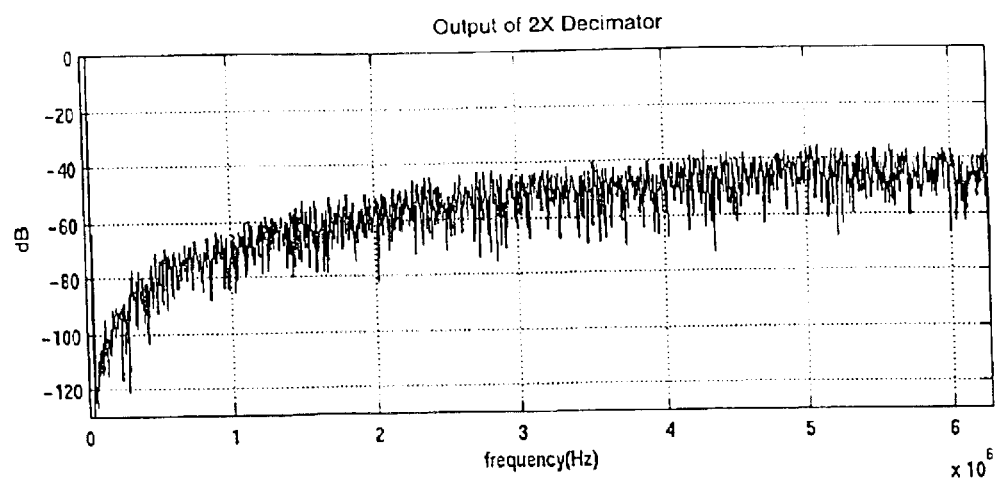
Figure 9D:
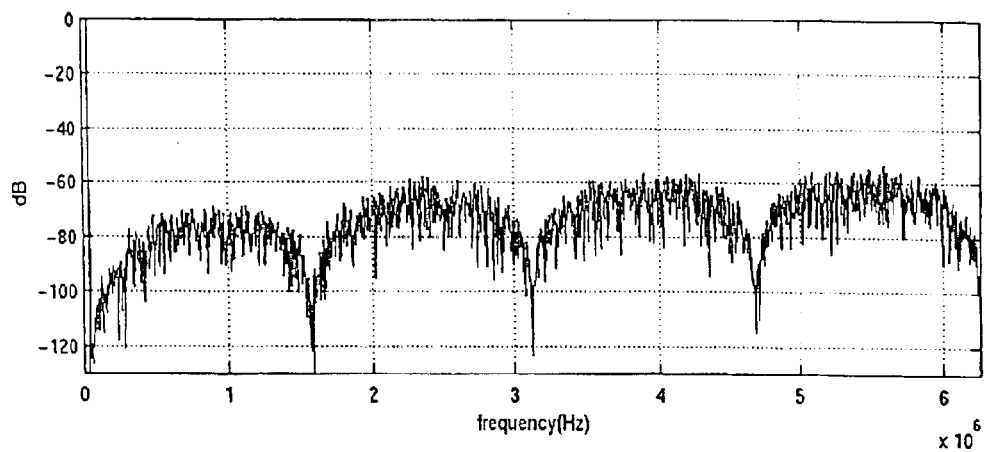
Figure 9E:
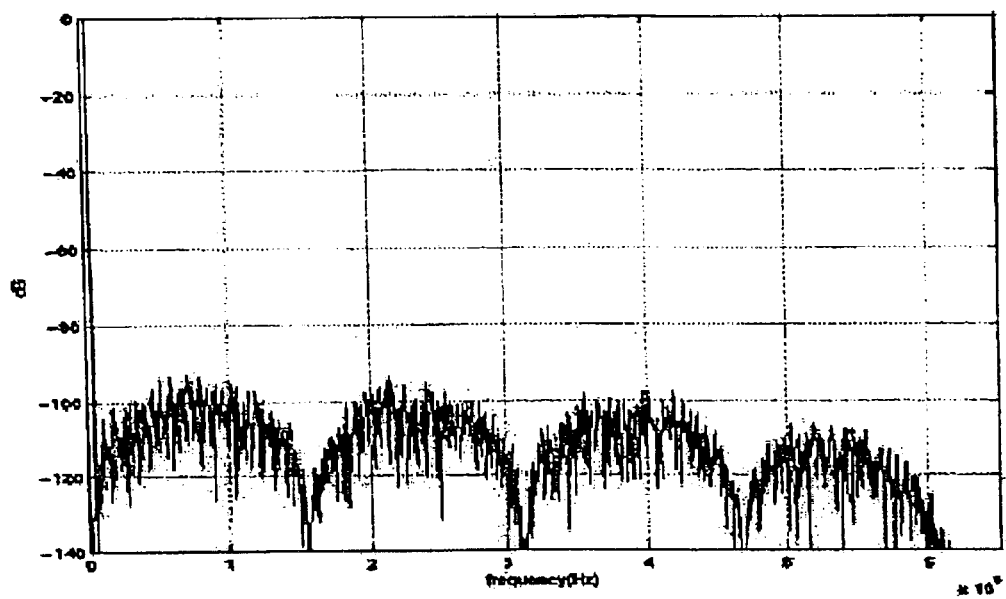

FIGS. 9A. 9B, 9C, 9D and 9E are exemplary frequency spectrum plots that show the frequency spectrum at various stages of Sigma-Delta DAC 200. FIG. 9A shows an exemplary frequency spectrum, ranging from 0–12.5 MHz, output by multi-bit sigma-delta modulator 204 (i.e., the frequency spectrum of quantized signal 206). FIG. 9B shows an exemplary frequency spectrum, ranging from 0–12.5 MHz, output by digital FIR filter 302 (i.e., the frequency spectrum of band-limited signal 304). FIG. 9C shows an exemplary frequency spectrum, ranging from 0–6.144 MHz, output by decimator 306 (i.e. the frequency spectrum of decimated digital signal 210). FIG. 9D shows an exemplary frequency spectrum, ranging from 0–6.144 MHz, output by analog multi-bit DAC 212 of FIG. 7 (i.e., the frequency spectrum of analog output signal 214). FIG. 9E shows an exemplary frequency spectrum after a 30 kHz one pole RC filter at the output of transimpedance amplifier 710, according to an embodiment of the present invention (i.e., the frequency spectrum of analog output signal 214').

VIII. Advantages of the Present Invention

An advantage of the present invention is that the clock frequency of analog components (e.g., of multi-bit DAC 212) following decimation filter 208 is reduced. Depending upon the implementation of decimation filter 208, the increase of inband quantization noise due to aliasing of the noise near fs/M can be made small or negligible. For example, if the decimation factor is two (i.e., M=2), then the clock frequency is halved. This relaxes the settling requirements of analog components without sacrificing the inband quantization noise performance. In the prior art described with reference to FIG. 1, the analog FIR frequency is the same as the modulator frequency. Thus, in the prior art of FIG. 1, a lower modulator clock frequency would result in a reduction in the oversampling ratio, and thus an increase in the inband quantization noise. This is a significant difference because a decrease in oversampling by a factor of two, for example, for a second order modulator-, would give a 15 dB higher quantization noise in the signal band.

When the amplitude of the AC component of the digital input signal 102 is small, idle tones are produced in the output of a sigma-delta DAC. The idle tones with largest amplitude are typically produced at frequencies close to one-half of the sample frequency of the sigma-delta DAC. There are several common causes for these idle tones to fold into the signal passband and degrade the dynamic range of the sigma-delta DAC. These causes include coupled digital noise and nonlinearities in the analog signal processing path at the output of the sigma-delta DAC. The sigma-delta DAC 200 of the present invention effectively filters quantization noise related to tones near one-half the sample frequency.

In some of the embodiments of the present invention discussed above, sigma-delta modulator 204 is a multi-bit modulator and the multi-bit DAC 212 provides mismatch shaping. These features, and the decimation filter 208, provide a multi-bit output (to drive elements 406) that has greatly less quantization noise compared to a one bit modulated output signal (e.g. signal 106).

This has a significant advantage in terms of reduced levels of out of band quantization noise and reduced amplitude of idle tones. This reduces sensitivity of the analog circuitry to digital noise coupling and to nonlinearities in the analog components of the DAC and filter circuitry. Sigma-delta DAC 200 reduces the complexity and difficulty of design of the analog filters by reducing the sensitivity of the design to nonlinearities in analog signal components, and by reducing the required degree of analog filtering.

IX. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention. For example, the specific number of taps of FIR filter 302 and/or delay line 510 can be changed, while still being within the spirit and scope of the present invention. For another example, the specific number of elements 406 and/or multi-bit sub-DACs 512 can be altered, while still being within the spirit and scope of the present invention. For still another example, an above described exemplary embodiment of mismatch shaping network 402b is shown as splitting a digital input code into foul sub-codes, which are each provided to one of four separate 4-term shufflers. However, one of ordinary skill in the art will appreciate from the above description that a digital input code can be split into a different number of sub-codes (i.e. other than four) while still being within the spirit and scope of the present invention. Additionally, one of ordinary skill in the art will appreciate from the above description that each of the shufflers can shuffle more or fewer than four terms as appropriate. These are just a few examples of changes to the present invention that can be made that are still within the spirit and scope of the present invention.

The present invention has been described above with the aid of functional building blocks and flow diagrams illustrating the performance of specified functions and relationships thereof. The boundaries of these functional building blocks and the steps of flow diagrams have often been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A digital to analog converter (DAC), comprising:
   means for quantizing a k-bit digital input signal;
   means for decimating the quantized k-bit digital signal; and
   means for outputting k analog signals based on the decimated k-bit digital signal, a sum of the k analog signals being representative of the k-bit digital input signal.

2. The DAC of claim 1, wherein:
   the means for quantizing comprises a 2-level quantizer; and
   the quantized k-bit digital signal comprises a single-bit digital signal.

3. The DAC of claim 1, wherein:
   the means for quantizing comprises a p-level quantizer, where p is an integer greater than 2; and
   the quantized k-bit digital signal comprises a multi-bit digital signal.

4. The DAC of claim 1, wherein the means for decimating comprises:
   means for filtering the quantized k-bit digital signal to produce a sequence of sample values; and
   a decimator producing the decimated k-bit digital signal based on the sequence of sample values of the filtered signal.

5. The DAC of claim 4, wherein:
   the decimator discards one of every two sample values in the sequence of sample values of the filtered signal to produce the decimated k-bit digital signal, the decimated k-bit digital signal having a sample frequency that is one half of a sample frequency of the filtered signal.

6. The DAC of claim 4, wherein:
   the means for filtering comprises a 3-tap digital FIR filter.

7. The DAC of claim 1, wherein each of the k analog signals is a current.

8. The DAC of claim 1, wherein each of the k analog signals is a charge.

9. The DAC of claim 1, wherein:
   the decimated k-bit digital signal is a binary signal; and
   wherein the k analog signals are binary weighted signals.

10. The DAC of claim 1, wherein the means for outputting comprises:
    means for coding that receives the decimated k-bit digital signal and produces the k-bit digital signal therefrom.

11. The DAC of claim 10, wherein:
    the decimated digital signal is an n-bit signal, and
    the means for coding receives the n-bit quantized k-bit digital signal and produces the decimated k-bit digital signal therefrom, where k does not equal n.

12. The DAC of claim 11, wherein:
    the n-bit decimated digital signal is a binary signal, and
    the means for coding is a binary to thermometer coder that converts the n-bit binary digital signal to the decimated k-bit digital signal, the decimated k-bit digital signal being a thermometer coded signal.

13. The DAC of claim 1, wherein the means for outputting comprises:
  means for mismatch shaping that receives the quantized k-bit digital signal and produces the decimated k-bit digital signal therefrom, the decimated k-bit digital signal being a shuffled signal.

14. The DAC of claim 1, wherein the means for outputting comprises:
  means for coding that receives the decimated k-bit digital signal and produces a coded signal therefrom; and
  means for mismatch shaping that receives the coded signal and produces the decimated k-bit digital signal therefrom, the decimated k-bit digital signal being a shuffled signal.

15. A method for converting a digital signal to an analog signal, comprising:
  (a) a step of quantizing a digital input signal;
  (b) a step of decimating the quantized digital signal; and
  (c) a step of outputting an analog output signal based on the decimated digital signal, the analog output signal being representative of the digital input signal.

16. The method of claim 15, wherein the step of quantizing comprises producing a single-bit quantized digital signal.

17. The method of claim 15, wherein the step of quantizing comprises producing a multi-bit quantized digital signal.

18. The method of claim 15, wherein the step of decimating comprises:
  a step of filtering the quantized digital signal to produce a filtered signal including a sequence of sample values, wherein the sequence of sampled values are decimated to become the decimated values.

19. The method of claim 18, wherein the step of decimating further comprises discarding one of every two sample values in the sequence of sample values of the filtered signal to produce the decimated digital signal, the decimated digital signal having a sample frequency that is one half of a sample frequency of the filtered signal.

* * * * *